United States Patent
Liu et al.

(10) Patent No.: US 9,941,380 B2
(45) Date of Patent: Apr. 10, 2018

(54) GRAPHENE TRANSISTOR AND RELATED METHODS

(71) Applicants: Taiwan Semiconductor Manufacturing Co., Ltd., Hsin-Chu (TW); National Taiwan University, Taipei (TW)

(72) Inventors: Shang-Yi Liu, New Taipei (TW); Samuel C. Pan, Hsinchu (TW); Chih-I Wu, Taipei (TW); Tsung-Chin Cheng, Taoyuan City (TW)

(73) Assignees: Taiwan Semiconductor Manufacturing Co., Ltd., Hsin-Chu (TW); National Taiwan University, Taipei (TW)

(*) Notice: Subject to any disclaimer, the term of this patent is extended or adjusted under 35 U.S.C. 154(b) by 0 days.

(21) Appl. No.: 14/954,741

(22) Filed: Nov. 30, 2015

(65) Prior Publication Data

US 2017/0154975 A1    Jun. 1, 2017

(51) Int. Cl.
| | | |
|---|---|---|
| *H01L 21/324* | (2006.01) | |
| *H01L 29/66* | (2006.01) | |
| *H01L 21/02* | (2006.01) | |
| *H01L 29/778* | (2006.01) | |

(52) U.S. Cl.
CPC .... *H01L 29/66045* (2013.01); *H01L 21/0212* (2013.01); *H01L 21/02118* (2013.01); *H01L 21/324* (2013.01); *H01L 29/778* (2013.01)

(58) Field of Classification Search
CPC ............ H01L 29/66; H01L 29/66045; H01L 21/02118; H01L 21/0212; H01L 21/324; H01L 29/778
See application file for complete search history.

(56) References Cited

U.S. PATENT DOCUMENTS

| | | | |
|---|---|---|---|
| 7,622,734 B2 | 11/2009 | Suwa et al. | |
| 2011/0309336 A1 | 12/2011 | Shin et al. | |
| 2012/0058350 A1* | 3/2012 | Long | B82Y 10/00 428/446 |
| 2012/0080658 A1* | 4/2012 | Yang | B82Y 10/00 257/9 |

(Continued)

OTHER PUBLICATIONS

Schwierz, Frank, "Graphene transistors", Nature Nanotechnology, Jul. 2010, pp. 487-496, vol. 5.

(Continued)

*Primary Examiner* — Fazli Erdem
(74) *Attorney, Agent, or Firm* — Haynes and Boone, LLP (57) ABSTRACT

A method and structure for providing high-quality transferred graphene layers for subsequent device fabrication includes transferring graphene onto a hydrophobic surface of a hydrophobic layer and performing a thermal treatment process. In various embodiments, a substrate including an insulating layer is provided, and a hydrophobic layer is formed over the insulating layer. In some examples, a graphene layer is transferred onto the hydrophobic layer. By way of example, the transferred graphene layer has a first carrier mobility. In some embodiments, after transferring the graphene layer, an annealing process is performed, and the annealed graphene layer has a second carrier mobility greater than the first carrier mobility.

20 Claims, 10 Drawing Sheets

(56) References Cited

U.S. PATENT DOCUMENTS

| 2015/0097193 | A1* | 4/2015 | Yap | H01L 29/775 |
| | | | | 257/76 |
| 2015/0299240 | A1* | 10/2015 | Cheng | C01B 25/26 |
| | | | | 428/402 |
| 2015/0364545 | A1* | 12/2015 | Heo | H01L 29/1033 |
| | | | | 257/24 |
| 2016/0005881 | A1* | 1/2016 | Fujii | H01L 51/0045 |
| | | | | 257/24 |

OTHER PUBLICATIONS

Deshpande, Tejas "Graphene Field Effect Transistors", http://technophilicmag.com/2011/02/07-graphene-field-effect-transistors/.

Feng, Lin, "Super-Hydrophobic Surfaces: From Natural to Artificial**"; Advanced Materials, 2002, vol. 14, No. 24, pp. 1857-1860.

Klekachev, Alexander, "Graphene Transistors and Photodetectors", Interface, The Electrochemical Society, Spring 2013, pp. 63-68.

Lafkioti, Myrsini, "Graphene on a Hydrophobic Substrate: Doping Reduction and Hysteresis Suppression under Ambient Conditions", American Chemical Society, Nano Letters, 2010, pp. 1149-1153, vol. 10.

Lee, Wi Hyoung et al., "Control of Graphene Field-Effect Transistors by Interfacial Hydrophobic Self-Assembled Monolayers", Advanced Materials, 2011, pp. 3460-3464, vol. 23.

\* cited by examiner

| GFET | Bare SiO$_2$ | | As-transferred | | Post-annealed | |
|---|---|---|---|---|---|---|
| | electron | hole | electron | hole | electron | hole |
| Mobility (cm$^{-2}$V$^{-1}$s$^{-1}$) | 273 | 1337 | 1708 | 6000 | 3800 | 11000 |
| Dirac point (V) | 89 | | 50 | | 35 | |

FIG. 12

GRAPHENE TRANSISTOR AND RELATED METHODS

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Graphene, a two-dimensional (2-D) sheet of carbon atoms bonded to one another in a hexagonal crystal lattice, has recently been introduced as a potential replacement channel material for transistor devices. In addition to its high intrinsic mobility, graphene has attracted great interest for its other unique properties such as large current densities, thermodynamic and mechanical stability, and high saturation velocity, among others. Large-area graphene films have been produced by a variety of methods such as epitaxial growth on silicon carbide (SiC) substrates, chemical vapor deposition (CVD)-growth (e.g., involving the catalyzed decomposition of hydrocarbons on a metal surface), and mechanical exfoliation (e.g., from a bulk graphite source), among others. By way of example, the fabrication of graphene-based devices generally involves transfer of a graphene layer (e.g., from a growth substrate or from the bulk graphite source), and onto a target substrate upon which the graphene-based device will be fabricated. As a result of the transfer process, grain boundaries, point defects, wrinkles, folds, tears, or other lattice imperfections may be introduced into the transferred graphene layer and thereby detrimentally affect the properties of any subsequently fabricated devices. Additionally, charged impurities adsorbed to and/or within the target substrate may cause unintentional doping of the transferred graphene layer (e.g., due to charge transfer doping) and thereby affect the quality and/or performance of subsequently fabricated graphene-based devices. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
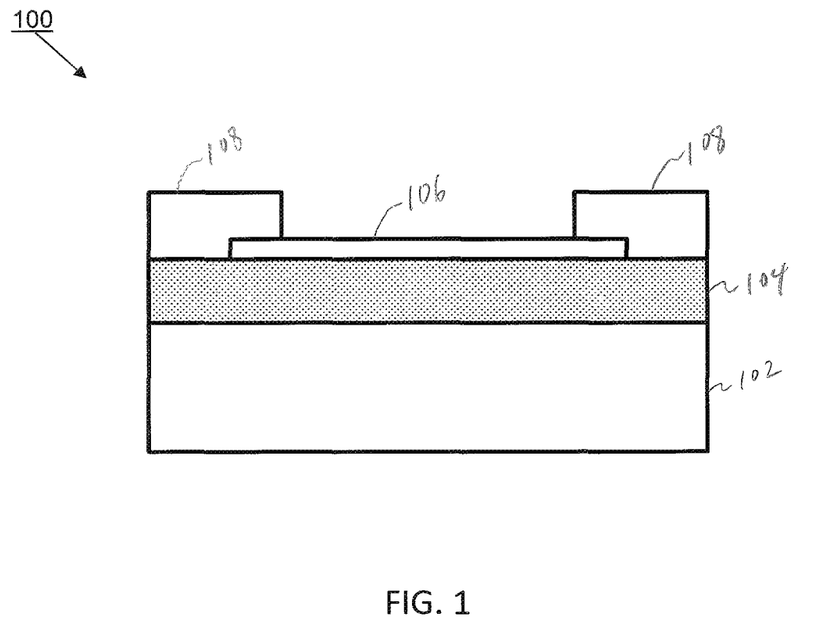
FIG. 1 is a cross-sectional view of a back-gated graphene device.

Illustrated in FIG. 1 is an exemplary back-gated graphene device 100. The graphene device 100 includes a substrate 102, an insulating layer 104 disposed on the substrate 102, a graphene layer 106 disposed on the insulating layer 104, and source/drain contacts 108 contacting ends of the graphene layer 106. The substrate 102 may be a semiconductor substrate such as a silicon substrate. The substrate 102 may include various doping configurations depending on design requirements as is known in the art. By way of example, the substrate 102 may include a highly-doped, low-resistivity substrate that allows the substrate 102 to be used as a global back-gate for the graphene device 100.

The insulating layer 104 may include a silicon dioxide ($SiO_2$) layer grown by thermal oxidation over the substrate 102. In some cases, a thickness of the insulating layer 104 may be chosen so as to optimize the contrast of the graphene layer 106 with respect to the underlying substrate 102. By way of example, the insulating layer 104 may have a thickness of about 90 nanometers (nm) or 280 nm. In some cases, the insulating layer 104 may have a thickness in a range from about 90-100 nm, or from about 280-300 nm.

The graphene layer 106 may include graphene produced by a variety of methods such as epitaxial growth on silicon carbide (SiC) substrates, chemical vapor deposition (CVD)-growth (e.g., involving the catalyzed decomposition of hydrocarbons on a metal surface), and mechanical exfoliation (e.g., from a bulk graphite source), among others. By way of example, the grown or exfoliated graphene layer 106 may be transferred (e.g., from a growth substrate or from the bulk graphite source) onto the insulating layer 104 of the substrate 102, which may be referred to as a "target substrate", upon which one or graphene-based devices may be fabricated. In various examples, the graphene transfer may be accomplished by a wet or dry transfer process. After transfer of the graphene layer 106 onto the insulating layer 104, metal source/drain contacts 108 may be formed. The metal source/drain contacts 108 may include a conductive layer such as Cr, Ti, Au, Ni, Pd, Ir, Ag, Pt, Cu, Co, Al, Fe, combinations thereof, and/or other suitable compositions. The source/drain contacts 108 may be formed using PVD, CVD, electron beam (e-beam) evaporation, and/or other suitable process. In some examples, a device 100 active region may be defined (e.g., prior to or after formation of the source/drain contacts 108) by an appropriate photolithography and etching process (e.g., an oxygen plasma etching process). Thus, the exemplary back-gated graphene device 100 of FIG. 1 includes the graphene layer 106 as the device channel, contacted by source/drain contacts 108, and the substrate 102 is a global back-gate separated from the graphene layer 106 by the insulating layer 104.

In various conventional methods, and as a result of the transfer of the graphene layer 106 onto the insulating layer 104, grain boundaries, point defects, wrinkles, folds, tears, or other lattice imperfections may be introduced into the transferred graphene layer 106 and thereby degrade the properties of any subsequently fabricated devices, such as the device 100. Additionally, charged impurities adsorbed to and/or within the target substrate (e.g., within the insulating layer 104 upon which the graphene layer 106 is transferred) may cause unintentional doping of the transferred graphene layer 106 (e.g., due to charge transfer doping) and thereby affect the quality and/or performance of subsequently fabricated graphene-based devices (e.g., device 100). Thus, existing techniques have not proved entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures for providing high-quality transferred graphene layers (e.g., onto a target substrate) that are substantially flat and which exhibit reduced substrate-effects (e.g., including reduction of charge-transfer doping of the graphene layer due to charged substrate impurities), for example by transferring graphene onto a hydrophobic surface and performing a thermal treatment process (e.g., an anneal). As used herein, the term "hydrophobic surface" is used to describe a surface having a contact angle (CA) that is between about 90° and about 150°. As used herein, the term "contact angle" is used to describe an angle that a liquid creates with a solid surface at an interface between the liquid and the solid surface. Additionally, in various embodiments, the term "hydrophobic surface" may be used to describe a surface that is substantially low-wetting or non-wetting, where the term "wetting" describes the ability of a liquid (e.g., such as water), to maintain contact with the hydrophobic surface. Stated another way, the term "hydrophobic surface" may be used to describe a surface that repels or excludes water from the hydrophobic surface. In accordance with embodiments of the present disclosure, a surface of the target substrate is treated to be hydrophobic prior to transfer of the graphene layer 106. For example, in some embodiments, a surface of the insulating layer 104 is treated to have a hydrophobic surface prior to transfer of the graphene layer 106 onto the insulating layer 104. In some embodiments, the surface of the insulating layer 104 may be treated with (e.g., coated with) a hydrophobic material including self-assembled monolayers (SAMs) of octadecyltrichlorosilane (ODTS) and/or octyltrichlorosilane (OTS), polymers such as polytetrafluoroethylene (PTFE), polyethylene (PE), polypropylene (PP), polystyrene (PS), polyimide (PI), and/or wax to provide the hydrophobic surface. As a result of treating the insulating layer 104 with the hydrophobic material to have a hydrophobic surface, and in various embodiments, charged impurities may be prevented from adsorbing to the hydrophobic surface coating of the insulating layer 104 and/or the hydrophobic surface coating of the insulating layer 104 may serve to screen charged impurities residing within the insulating layer 104. Thereafter, in various embodiments, the as-transferred graphene layer 106 (i.e., as-transferred onto the hydrophobic surface) may be annealed at a temperature of about 200° C. for a duration of about 2 hours. In various embodiments, the annealing temperature may be varied, for example, by about +/−50° C. Thus, in some cases, the as-transferred graphene layer 106 may be annealed at a temperature from about 150° C. to about 250° C. for a duration of about 2 hours. As a result of the thermal treatment process (e.g., annealing process), the as-transferred graphene, on the hydrophobic surface, may be flatter and cleaner (e.g., as observed by electrical characterization and characterization of surface morphology). As merely one example, in some embodiments, graphene on a SAM-coated insulating layer (e.g., the insulating layer 104) may have an RMS roughness value of about 1.65 nanometers (nm), in contrast to graphene a bare $SiO_2$ insulating layer, which may have an RMS roughness value of about 2.25 nm. In various embodiments, the annealing process also serves to remove moisture which may be present between the as-transferred graphene and the hydrophobic surface of the insulating layer onto which the graphene is transferred. Thus, as a result of the thermal treatment process, the as-transferred graphene, on the hydrophobic surface, may also exhibit improved carrier mobility. In some embodiments, after the annealing process, top electrodes (e.g., source/drain electrodes) may be deposited onto the annealed graphene layer 106.

Figure 2:
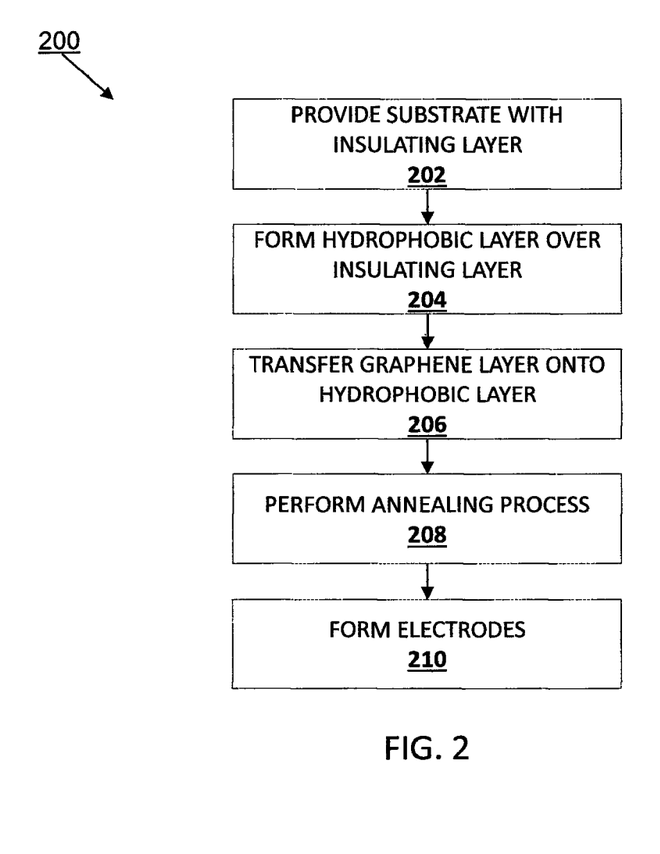
FIG. 2 is a flow chart of a method of fabricating a graphene device according to one or more aspects of the present disclosure.
Figure 3:
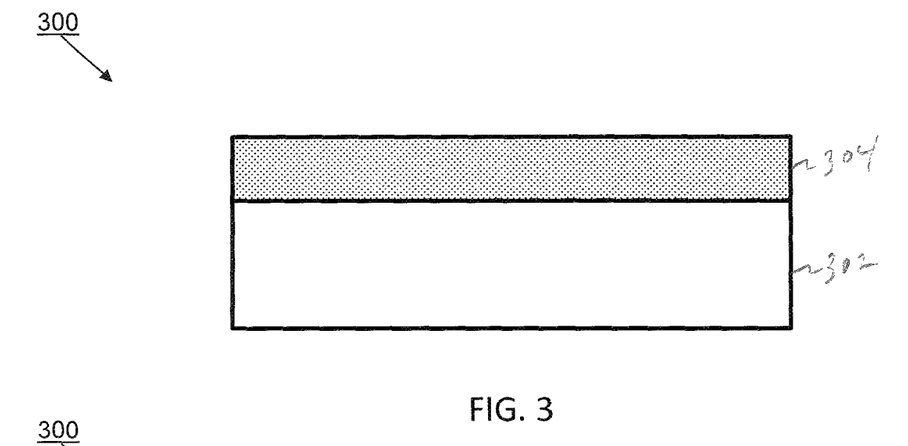
FIGS. 3-6 illustrate cross sectional views of embodiments of a graphene device according to one or more aspects of the present disclosure and corresponding to one or more steps of the method of FIG. 2.

Referring now to FIG. 2, illustrated is a flow chart of a method 200 of fabricating a graphene device according to one or more aspects of the present disclosure. The method 200 may be used to implement graphene-based transistor including methods for providing a substantially flat and clean graphene surface, and thereby improve the graphene carrier mobility (e.g., mobility of electrons and holes in the graphene layer). In some embodiments, the method 200 may be used to fabricate the device 100, described above with reference to FIG. 1. Thus, one or more aspects discussed above with reference to the device 100 may also apply to the method 200. Additionally, FIGS. 3-6 are cross sectional views of embodiments of a graphene device 300 according to one or more aspects of the present disclosure and corresponding to one or more steps of the method of FIG. 2.

It is understood that parts of the method 200 and/or the graphene device 300 may be fabricated by a well-known complementary metal-oxide-semiconductor (CMOS) technology process flow, and thus some processes are only briefly described herein. In addition, as described above, the device 300 may share aspects of the device 100, thus some aspects and/or processes of the device 300 are only discussed briefly for purposes of clarity in understanding. Further, the graphene device 300 may include, and/or may be integrated with various other devices and features, such as additional transistors, bipolar junction transistors, resistors, capacitors, diodes, fuses, etc., but is simplified for a better understanding of the inventive concepts of the present disclosure. Further, in some embodiments, the graphene device 300 includes a plurality of graphene devices (e.g., transistors), which may be interconnected.

In various embodiments, the graphene device 300 may be an intermediate device fabricated during processing of an integrated circuit, or portion thereof, that may comprise static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), complementary metal-oxide-semiconductor (CMOS) transistors, bipolar transistors, high voltage transistors, high frequency transistors, other memory cells, and/or combinations thereof. In some embodiments, the graphene device 300 may be formed over a substrate (e.g., the substrate 102) having a dielectric layer (e.g., dielectric layer 104) disposed thereon, where the substrate may include CMOS transistors (or other devices mentioned above) formed within the substrate 102, and where electrodes of the graphene device 300 (e.g., source/drain contacts 108) and electrodes of devices within the substrate 102 may be connected through the dielectric layer by way of one or more contacts, vias, or other electrical interconnects.

Referring now to the method 200, the method 200 begins at block 202 where a substrate having an insulating layer is provided. Referring to the example of FIG. 3, and in an embodiment of block 202, illustrated therein is a device 300 including a substrate 302. The substrate 302 may be substantially similar to the substrate 102 discussed above with reference to the device 100 of FIG. 1. For example, the substrate 302 may be a semiconductor substrate such as a silicon substrate, and the substrate 302 may include various doping configurations depending on design requirements as is known in the art. In various embodiments, the substrate 302 may include a highly-doped (e.g., N+ or P+), low-resistivity substrate (e.g., less than 5 mOhm-cm) that allows the substrate 302 to be used as a global back-gate for the device 300. In a further embodiment of block 202, an insulating layer 304 may be formed over the substrate 302. The insulating layer 304 may be substantially similar to the insulating layer 104 discussed above with reference to the device 100 of FIG. 1. For example, the insulating layer 304 may include a $SiO_2$ layer grown by thermal oxidation over the substrate 302. However, other methods of oxide deposition may be used (e.g., CVD) without departing from the scope of the present disclosure. In some embodiments, the insulating layer 304 may have a thickness of about 90 nm or 280 nm. In some cases, the insulating layer 304 may have a thickness in a range from about 90-100 nm, or from about 280-300 nm.

The method 200 then proceeds to block 204 where a hydrophobic layer is formed over the insulating layer. Referring to the example of FIG. 4, and in an embodiment of block 204, a hydrophobic layer 402 is formed over the insulating layer 304, thereby providing a hydrophobic surface 404 (onto which a graphene layer may be subsequently transferred) over the insulating layer 304. In some embodiments, prior to forming the hydrophobic layer 402 over the insulating layer 304, the surface of the insulating layer may be cleaned to remove organic residues. For example, in some embodiments, the device 300 may be soaked in a piranha solution (i.e., a mixture of sulfuric acid and hydrogen peroxide) to remove organic residues from a surface of the insulating layer 304, and to hydroxylate the surface of the insulating layer 304. In some examples, the piranha solution clean may be performed for a duration of about 30 minutes, and in some cases may be performed multiple times (e.g., twice). By way of example, and in some embodiments, after cleaning the insulating layer 304 using the piranha solution, the device 300 may be rinsed in ultrapure water (UPW), in an ultrasonic bath, to remove residues which may remain from the piranha solution clean. In some embodiments, the rinse/ultrasonic bath process may be performed for a duration of about 10 minutes, and in some cases may be performed multiple times (e.g., three times).

Returning to FIG. 4, and in various embodiments, the hydrophobic layer 402 provides the hydrophobic surface 404 having a contact angle (CA) that is between about 90° and about 150°. By way of example, the hydrophobic layer 402 may include a hydrophobic material such as self-assembled monolayers (SAMs) of octadecyltrichlorosilane (ODTS) and/or octyltrichlorosilane (OTS), polymers such as polytetrafluoroethylene (PTFE), polyethylene (PE), polypropylene (PP), polystyrene (PS), polyimide (PI), and/or wax. In some examples, the hydrophobic layer 402 may include a single layer or a plurality of layers (e.g., a multilayer film). In some embodiments, the hydrophobic layer 402 may be formed using solvent casting, solvent painting, thermal spray processing, spin coating, immersion (e.g., into a solution including the hydrophobic material), PVD, CVD, electron beam (e-beam) evaporation, pulsed laser deposition, plasma polymerization, and/or other suitable process. In some embodiments, the hydrophobic material used to form the hydrophobic layer 402 may be dispensed (e.g., over the insulating layer 304) as a solution. For example, a solution of OTS or ODTS in anhydrous toluene (0.3 M)/5 ppm may be used. In some embodiments, the device 300, having the cleaned insulating layer 304 described above, may be immersed into a solution of the hydrophobic material (e.g., a solution of OTS or ODTS) for about 24 hours to form the hydrophobic layer 402. In some examples, after forming the hydrophobic layer 402, the device 300 may be cleaned in a solution of anhydrous toluene and ethanol (EtOH), in an ultrasonic bath, for about 15 minutes. In some embodiments, after forming the hydrophobic layer 402 and cleaning the device 300, the device 300 may be baked (e.g., in an oven, in a furnace, or on a hot plate) at about 150 degrees Celsius for about 60 minutes. In various embodiments, the hydrophobic layer 402 may advantageously prevent charged impurities from adsorbing onto the hydrophobic surface 404, and/or the hydrophobic layer 402 may serve to screen charged impurities residing within the insulating layer 304 or the substrate 302, thereby mitigating charge-transfer doping of a graphene layer subsequently transferred onto the hydrophobic layer 402. While some examples of hydrophobic materials useful for forming the hydrophobic layer 402 have been given, the examples provided are not meant to be limiting in any way, and it will be understood that other materials may be used to form the hydrophobic layer 402, and thereby provide the hydrophobic surface 404, without departing from the scope of the present disclosure.

Figure 4:
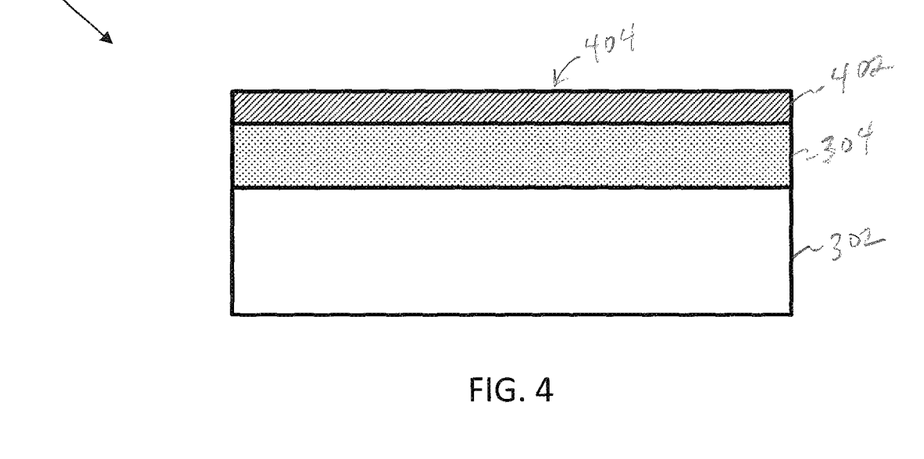
Figure 5:
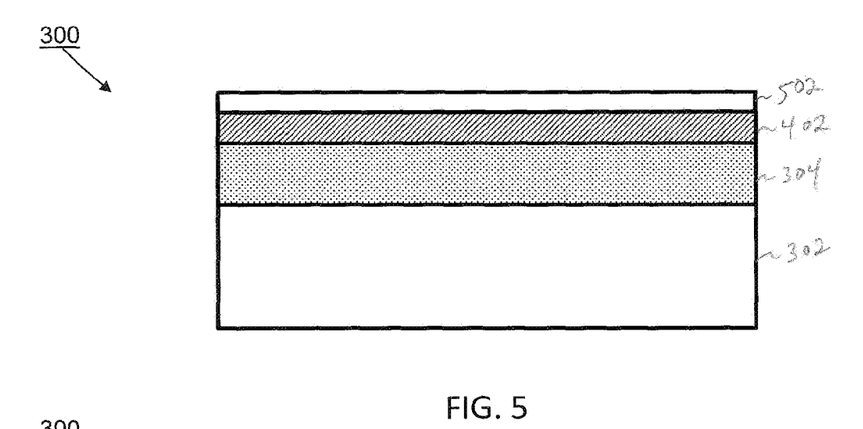

It is also noted that self-assembled monolayers (SAMs), as discussed herein, include ordered molecular assemblies (e.g., organic molecules) that form spontaneously by adsorption of molecules on a solid substrate (e.g., adsorption onto the insulating layer 304). In various examples, a SAM surfactant molecule may include a head group, an alkyl chain, and a terminal group. The head group may have a high affinity to the solid substrate (e.g., the insulating layer 304), and may thus chemically interact with the substrate onto which it is deposited. In various embodiments, SAM molecules may adsorb at substantially all surface sites (e.g., of the insulating layer 304), resulting in a close-packed monolayer. In some embodiments, a SAM head groups may include alkanethiols [X—$(CH_2)$n-SH] (e.g., when the underlying surface includes a metal such as Ag, Au, and Cu, or other appropriate metal) and alkyltrichlorosilanes [X—$(CH_2)_n$—$SiCl_3$] (e.g., when the underlying surface includes the insulating layer 304, and where the insulating layer 304 includes an oxide such as $SiO_2$, $Al_2O_3$, and/or other oxide/dielectric material or dielectric substrate as described herein). In addition, Van der Waals interactions between SAM alkyl chains are effective to cause ordering of the SAMs. In various embodiments, the terminal group is exposed at a surface (e.g., at the hydrophobic surface 404), for example, upon which the graphene layer will be transferred. By way of example, the SAM alkyl chain may be terminated with various groups (e.g., $CH_3$, OH, COOH, $NH_2$, etc.), allowing the SAM to be applied for the modification of surface properties (e.g., to create the hydrophobic surface 404).

The method 200 then proceeds to block 206 where a graphene layer is transferred onto the hydrophobic layer. Referring to the example of FIG. 5, and in an embodiment of block 206, a graphene layer 502 is transferred onto the hydrophobic layer 402. The graphene layer 502 may be substantially similar to the graphene layer 106 discussed above with reference to the device 100 of FIG. 1. For example, the graphene layer 502 may include graphene produced by a variety of methods such as epitaxial growth on silicon carbide (SiC) substrates, chemical vapor deposition (CVD)-growth (e.g., involving the catalyzed decomposition of hydrocarbons on a metal surface), liquid phase exfoliation, mechanical exfoliation (e.g., from a bulk graphite source), and/or other methods as known in the art. In various embodiments, the graphene layer 502 may include monolayer graphene, bilayer graphene, or multi-layer graphene (e.g., including more than two layers). CVD-growth of graphene, as described herein, may be performed using on a variety of metal substrates such as Cu, Ni, Co, Ru, Ir, Pt, or other appropriate metal, as well as using any of a variety of carbon sources such as hydrocarbons including methane ($CH_4$), acetylene ($C_2H_2$), ethylene ($C_2H_4$), or others known in the art. By way of example, the grown or exfoliated graphene layer 502 may be transferred (e.g., from a growth substrate or from the bulk graphite source) onto the hydrophobic layer 402. In various examples, the graphene transfer may be accomplished by a wet or dry transfer process. As such, in various embodiments, the graphene transfer may be accomplished using a poly(methyl methacrylate) (PMMA)-assisted method or a polymer-free transfer process. As merely one example of the PMMA-assisted method, after graphene growth (e.g., CVD graphene growth on a metal substrate), the graphene-on-metal substrate may be spin-coated with a PMMA support layer, and the metal substrate may be etched away in a metal etching solution, leaving behind a PMMA/graphene film. In various embodiments, and depending on the metal substrate used for the CVD graphene growth, the metal etching solution may include ferric chloride ($FeCl_3$), nitric acid ($HNO_3$), ammonium persulfate ($(NH_4)_2S_2O_8$), or other metal etching solutions as known in the art. In some embodiments, the PMMA/graphene film may then be transferred to another substrate (e.g., the substrate 302 including the hydrophobic layer 402), after which the PMMA support layer may be dissolved using a solvent (e.g., acetone). Alternatively, in various embodiments, the graphene transfer process may be performed using polydimethylsiloxane (PDMS), thermal release tape, a roll-to-roll transfer process, an electrochemical process, a direct transfer process (e.g., using applied pressure and/or heat), or other wet and/or dry transfer processes as known in the art. While some examples of graphene growth and transfer have been provided, such examples are not meant to be limiting in any way, and other methods of graphene growth and/or transfer may be used without departing from the scope of the present disclosure.

Figure 9:
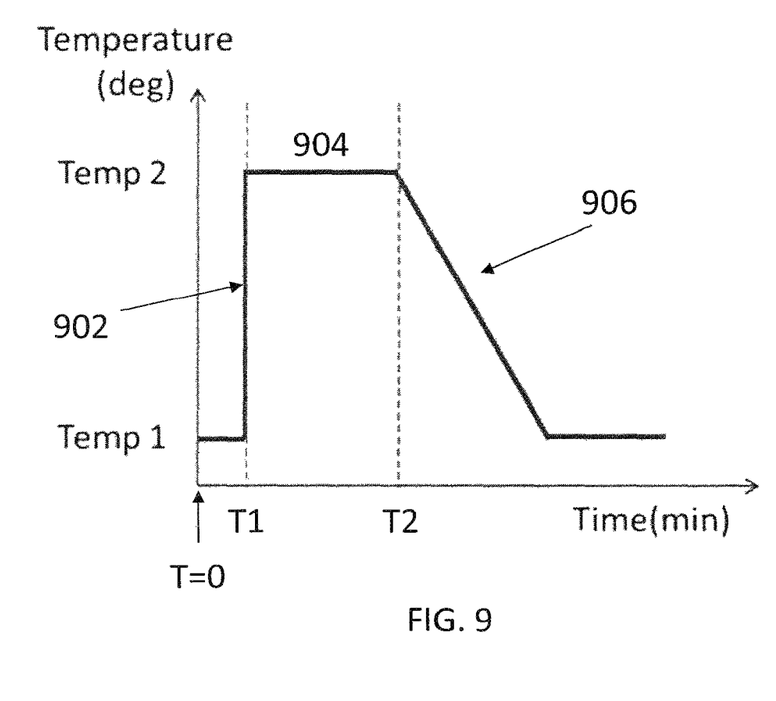
FIG. 9 is a temperature profile for a method of annealing a graphene device according to one or more aspects of the present disclosure.

The method 200 then proceeds to block 208 where an anneal process is formed. Again referring to the example of FIG. 5, and in an embodiment of block 208, the device 300 including the transferred graphene layer 502 (i.e., as-transferred onto the hydrophobic surface 404 of the hydrophobic layer 402) may be annealed in order to further improve the quality of the as-transferred graphene (e.g., flatten and clean), and thereby further improve the graphene carrier mobility. In particular, in various embodiments, the annealing process of block 208 serves to remove moisture which may be present between the transferred graphene layer 502 and the hydrophobic surface 404 of the hydrophobic layer 402 onto which the graphene is transferred. In various embodiments, the improved quality of the annealed, as-transferred graphene may be observed, for example, by electrical characterization and/or characterization of surface morphology. As merely one example, in some embodiments, graphene on a SAM-coated insulating layer may have an RMS roughness value of about 1.65 nanometers (nm), in contrast to graphene on a bare $SiO_2$ insulating layer, which may have an RMS roughness value of about 2.25 nm. Various embodiments of the anneal process of block 208 may be understood and explained in more detail with reference to FIG. 9, which shows a temperature profile for a method of annealing the graphene device 300. As illustrated in FIG. 9, a time (T) equal to zero (0) (T=0) may be the time at which the graphene layer 502 is transferred to the hydrophobic layer 402. As illustrated by the temperature profile of FIG. 9, the device 300 (and thus the transferred graphene layer 502), may initially be subjected to a temperature 'Temp 1'. In some embodiments, 'Temp 1' may be equal to about 25° C. +/−25° C. Thus, by way of example and in various embodiments, 'Temp 1' may be in a range of about 0° C. to about 50° C. In some embodiments, at a time 'T1', the temperature may be increased from 'Temp 1' to 'Temp 2', for example, at a ramp rate 902. By way of example, the ramp rate 902 may be greater than or equal to about 60° C./min, and 'Temp 2' may be equal to about 200° C. +/−50° C. Thus, by way of example and in various embodiments, 'Temp 2' may be in a range of about 150° C. to about 250° C. In various embodiments, an annealing time 904 may be between about 10 minutes and about 240 minutes. In some examples, the anneal process may be performed in a nitrogen ($N_2$) ambient. Alternatively, in some embodiments, the anneal process may be performed in a noble gas ambient (e.g., such as helium, neon, argon, etc.). In at least some embodiments, the annealing process of block 208 may be performed at a temperature of about 200° C. for about 2 hours. In some cases, the annealing process of block 208 may be performed at a temperature from about 150° C. to about 250° C. for a duration of about 2 hours. In some embodiments, at a time 'T2', the temperature may be decreased from 'Temp 2' to 'Temp 1', for example, at a ramp rate 906. By way of example, the ramp rate 906 may be less than or equal to about 1° C./min, and 'Temp 1' may be as described above. In some embodiments, the annealing temperature slope is a swing profile. By way of example, the annealing process of the block 208 may be performed using thermal radiation (e.g., thermal oven), using heat conduction (e.g., hot plate), using an optoelectronic method (e.g., laser annealing), or other appropriate method. In various embodiments, the annealing process of block 208 may be performed at a pressure of about $10^{-3}$ Torr.

The method 200 then proceeds to block 210 electrodes are formed. Referring to the example of FIG. 6, after the annealing process described above and in an embodiment of block 210, source/drain electrodes 602 may be formed over the annealed graphene layer 502. In some embodiments, the metal source/drain electrodes 602 may include a conductive layer such as Cr, Ti, Au, Ni, Pd, Ir, Ag, Pt, Cu, Co, Al, Fe, combinations thereof, and/or other suitable compositions. In various embodiments, the source/drain electrodes 602 may be formed using PVD, CVD, electron beam (e-beam) evaporation, and/or other suitable process. In some examples, the source/drain electrodes 602 may be formed using a metal lift-off process. In some examples, a device 300 active region may be defined (e.g., prior to or after formation of the source/drain electrodes 602) by an appropriate photolithography and etching process (e.g., an oxygen plasma etching process). Thus, back-gated graphene device 300 of FIG. 6 includes the flat, clean graphene layer 502 (device channel) on the hydrophobic layer 402, where the graphene layer is contacted by source/drain electrodes 602, and the substrate 302 serves as a global back-gate separated from the graphene layer 502 by the insulating layer 304 and the hydrophobic layer 402. In some cases, a metal layer (e.g., Al) may be evaporated onto a surface 604 of the substrate 302 in order to improve contact to the substrate 302.

The device 300 may undergo further processing to form various features and regions known in the art. For example, subsequent processing may form various contacts/vias/lines and multilayers interconnect features (e.g., metal layers and interlayer dielectrics) on the substrate 302, configured to connect the various features to form a functional circuit that may include one or more graphene devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. In some embodiments, the graphene device 300 may be formed over a substrate having a dielectric layer disposed thereon, where the substrate may include CMOS transistors (or other devices mentioned above) formed within the substrate, and where electrodes of the graphene device 300 (e.g., source/drain electrodes 602) and electrodes of devices within the substrate may be connected through the dielectric layer by way of one or more contacts, vias, or other electrical interconnects. Moreover, additional process steps may be implemented before, during, and after the method 200, and some process steps described above may be replaced or eliminated in accordance with various embodiments of the method 200.

Figure 6:
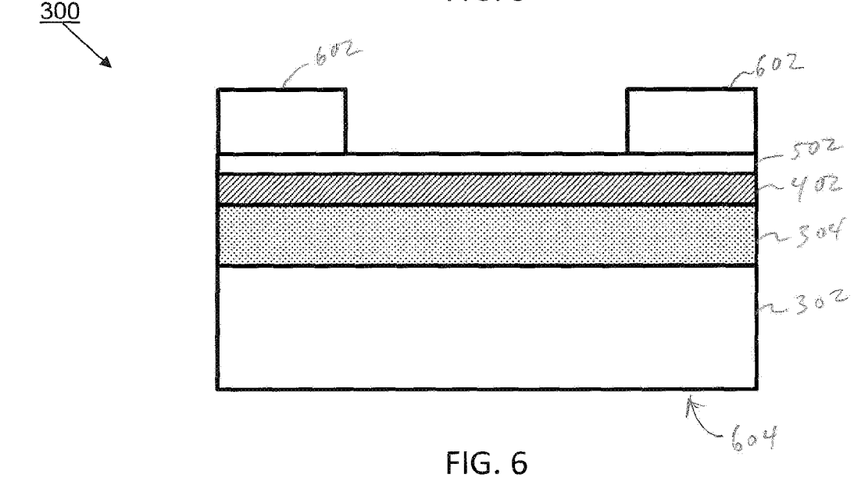
Figure 7:
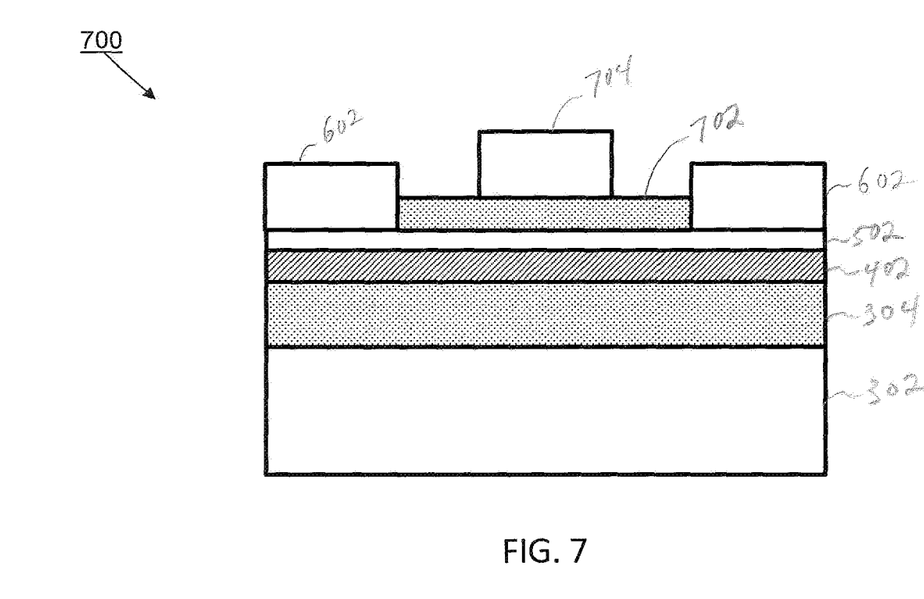
FIG. 7 is a cross-sectional view of a dual-gated graphene device according to one or more aspects of the present disclosure.

With reference now to FIG. 7, illustrated therein is a cross-sectional view of a dual-gated graphene device 700 according to one or more aspects of the present disclosure. In various embodiments, the device 700 may be processed in a manner substantially similar to the device 300 described above with respect to the method 200. By way of illustration, after formation of the back-gated device, as shown in FIG. 6, additional processing may be performed to fabricate the dual-gated device of FIG. 7. For example, in some embodiments, after formation of the source/drain electrodes 602, a top-gate dielectric layer 702 may be formed over the graphene layer 502. Due to the inert nature of graphene, in some examples, a nucleation and/or functionalization layer (or nucleation/functionalization treatment) may be formed (or performed) prior to formation of the dielectric layer 702 in order to enable the deposition of the dielectric layer 702 onto the graphene layer 502. Merely for purposes of illustration, in some embodiments, an Al nucleation layer may be formed prior to deposition of an Al2O3 layer. For further illustration, in some examples, an ozone ($O_3$) pre-treatment may be performed prior to deposition of the dielectric layer 702. While some examples of forming a nucleation layer on graphene, or of performing a functionalization treatment, have been provided, these examples are not meant to be limiting in any way, and those of skill in the art will recognize other nucleation layers and/or functionalization treatments that may be performed without departing from the scope of the present disclosure.

In various embodiments, the dielectric layer 702 may include a high-K dielectric layer, or in some cases may include a high-K layer formed over an interfacial layer. High-K dielectrics, as used and described herein, include dielectric materials having a high dielectric constant, for example, greater than that of thermal silicon oxide (~3.9). In some embodiments, the interfacial layer (if present) may include a dielectric material such as $SiO_2$, HfSiO, or SiON. In various embodiments, the high-K dielectric layer of the dielectric layer 702 may include a dielectric layer such as $HfO_2$, $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. Each of the interfacial layer and the high-K dielectric layer of the dielectric layer 702 may be formed by ALD, physical vapor deposition (PVD), CVD, chemical oxidation, thermal oxidation, and/or other suitable methods.

Still referring to FIG. 7, after formation of the dielectric layer 702, a top-gate electrode 704 may be formed. By way of example, in some embodiments, the top-gate electrode 704 may include a conductive layer such as W, TiN, TaN, WN, Re, Ir, Ru, Mo, Al, Cu, Co, Ni, Cr, Ti, Au, Pd, Ag, Pt, Fe, combinations thereof, and/or other suitable compositions. In some embodiments, the top-gate electrode 704 may alternately include a polysilicon layer. The top-gate electrode 704 may be formed using PVD, CVD, electron beam (e-beam) evaporation, and/or other suitable process. In some examples, the top-gate electrode 704 may be formed using a metal lift-off process. Thus, the device 700 of FIG. 7 provides a dual-gate structure, including the flat, clean graphene layer 502 (device channel) on the hydrophobic layer 402, and including the substrate 302 as the global back-gate and the top-gate electrode 704 as a top-gate.

Figure 8:
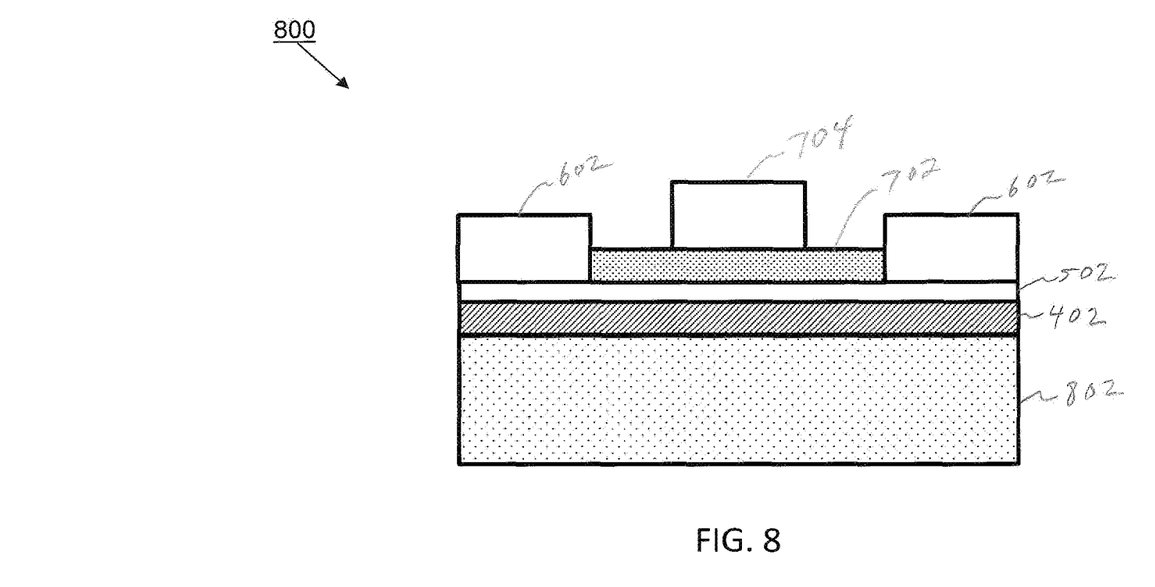
FIG. 8 is a cross-sectional view of a top-gated graphene device according to one or more aspects of the present disclosure.

Referring to FIG. 8, illustrated therein is a cross-sectional view of a top-gated graphene device 800 according to one or more aspects of the present disclosure. In various embodiments, aspects of the device 800 may be formed in a manner similar to the device 300 described above with respect to the method 200, and/or as discussed above with reference to the device 700 of FIG. 7. By way of illustration, and in an embodiment of block 204 of the method 200, the hydrophobic layer 402 is formed over an insulating layer. However, in the example of FIG. 8, the insulating layer (onto which the graphene layer is transferred) includes an insulating substrate 802. For example, in various embodiments, the insulating substrate 802 may include quartz, glass, ceramic, silicon carbide (SiC), as well as other insulating or semi-insulating substrates as known in the art. In at least some embodiments, an insulating substrate may be beneficial for radio-frequency (RF) graphene devices. After transfer of the graphene layer 402 to the insulating substrate 802, the device 800 may be processed substantially the same as described above. For example, the annealing process may be performed (block 208), the source/drain electrodes 602 may be formed, and the dielectric layer 702/top-gate 704 may be formed. Thus, the device 800 of FIG. 8 provides a top-gate structure including the flat, clean graphene layer 502 (device channel) on the hydrophobic layer 402, and the top-gate electrode 704 as a top-gate. It is noted that the device 800 does not include a global back-gate due to the insulating substrate 802.

Figure 10:
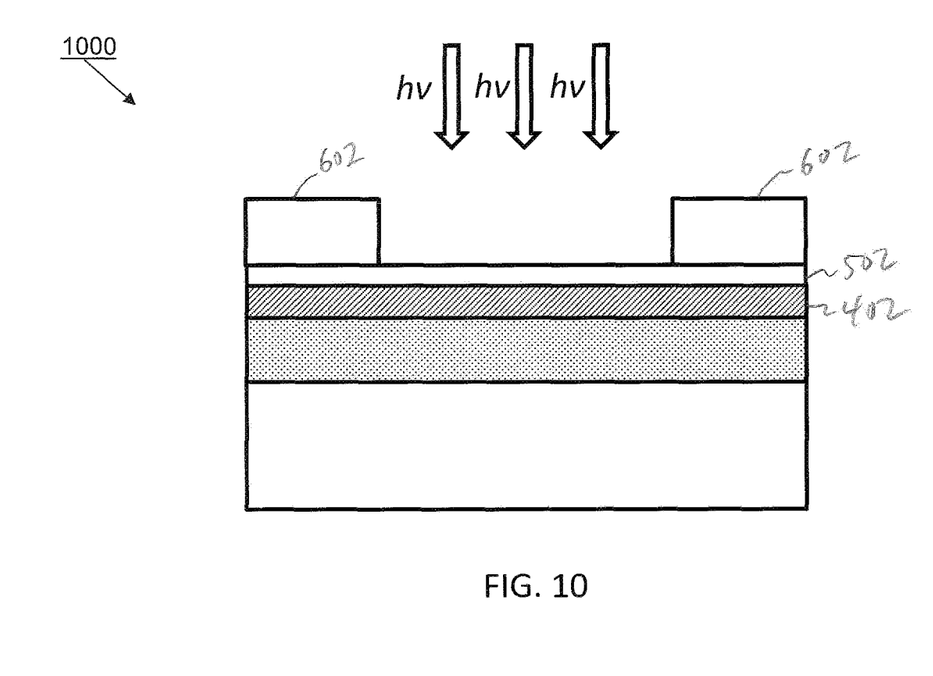
FIG. 10 is a cross-sectional view of a back-gated graphene photodetector according to one or more aspects of the present disclosure.

With reference to FIG. 10, illustrated therein is a cross-sectional view of a back-gated graphene photodetector 1000 according to one or more aspects of the present disclosure. In various embodiments, the device 1000 may be processed in a manner substantially similar to the device 300 described above with respect to the method 200. As shown in FIG. 10, the device 1000 may be used to detect incident photons (e.g., denoted as arrows labeled 'hv'). The operation of graphene photodetectors generally includes: (1) carrier generation by absorption of incident photons in a semiconducting layer, (2) carrier transport and multiplication, and (3) extraction of photo-generated carriers as current (e.g., via source/drain electrodes 602). Due to graphene's lack of a band gap, the sensitivity of the graphene photodetector 1000, particularly when employing a single graphene sheet as the graphene layer 502, may be low. Thus, in some embodiments, the graphene layer 502 may include bilayer or multilayer graphene (e.g., for the purpose of opening a band gap in graphene), particularly in embodiments including the photodetector 1000. In some examples, a surface of the graphene layer 502 may be coated with a light absorbing material (e.g., such as CdSe/ZnS quantum dots (QDs), PbS QDs, etc.), for example, to enhance carrier generation and subsequent current extraction. In various embodiments, the sensitivity of the graphene photodetector 1000 may be enhanced due to use of the hydrophobic layer 402, coupled with the annealing process (block 208), which results in the graphene layer 502 being cleaner and flatter, as discussed above.

Figure 11:
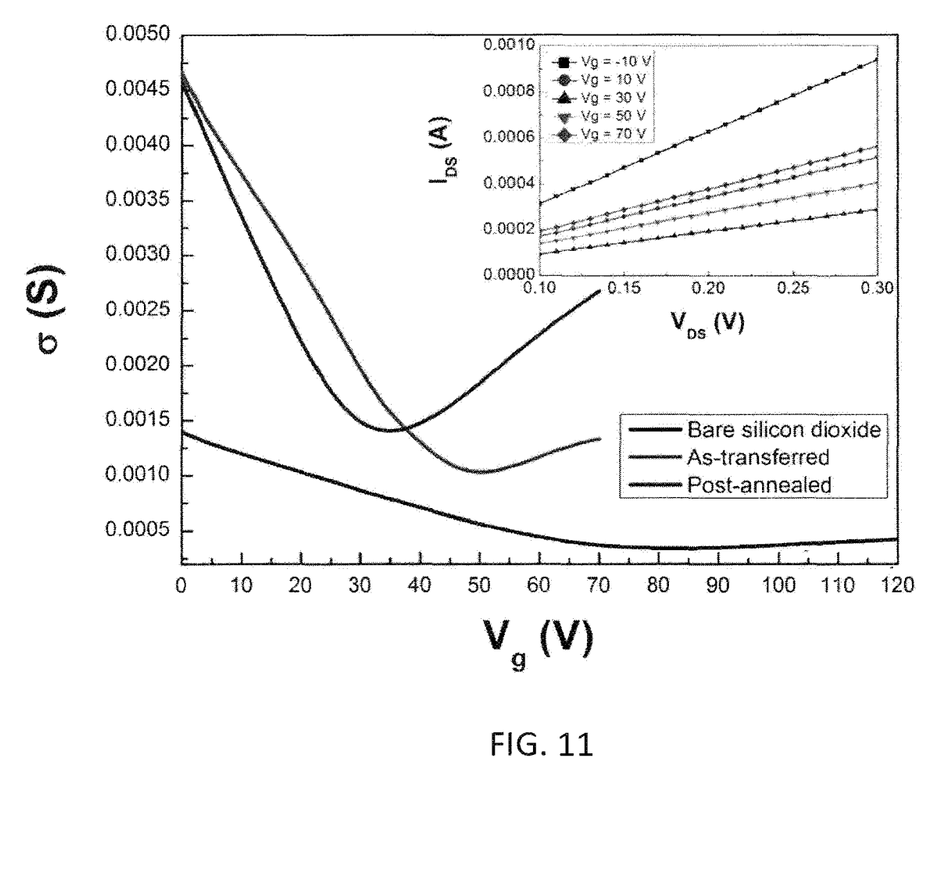
FIG. 11 illustrates conductivity versus gate voltage for various graphene devices, in accordance with one or more aspects of the present disclosure.
Figure 12:
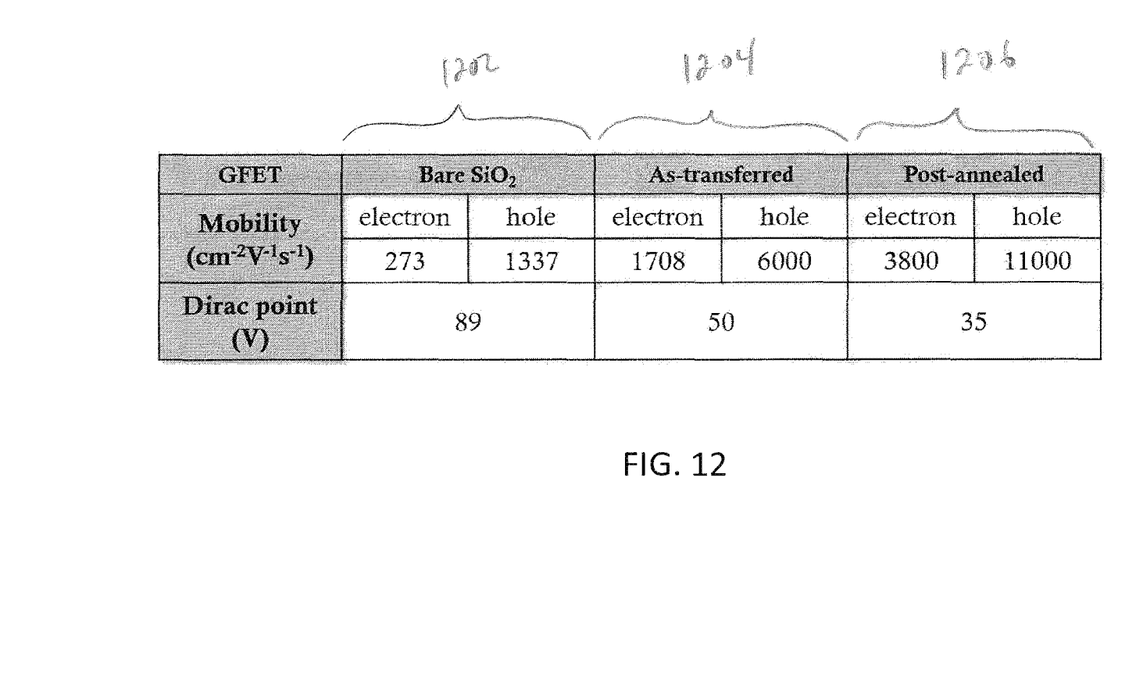
FIG. 12 illustrates a table including electronic properties for various graphene devices, in accordance with one or more aspects of the present disclosure.

FIGS. 11 and 12 provide exemplary electrical characteristics for at least some device fabricated according to the methods disclosed herein. FIG. 11 shows conductivity versus gate voltage for exemplary graphene devices, illustrating the benefit (e.g., to graphene device mobility) for devices fabricated in accordance with one or more aspects of the present disclosure. The inset of FIG. 11 shows the output characteristics for an exemplary graphene device at various values of gate voltage (Vg). FIG. 12 provides a table including electronic properties for various exemplary graphene devices, once again illustrating the benefit to graphene device mobility, for devices fabricated in accordance with one or more aspects of the present disclosure. For example, column 1202 illustrates the carrier mobility (273 cm$^2$/V-s for electrons; 1337 cm$^2$/V-s for holes) and Dirac point (89 V) for a graphene transistor fabricated on a bare SiO$_2$ substrate (e.g., without a hydrophobic layer or the annealing process of block 208). Column 1204 illustrates the carrier mobility (1708 cm$^2$/V-s for electrons; 6000 cm$^2$/V-s for holes) and Dirac point (50 V) for a graphene transistor fabricated on an ODTS-coated SiO$_2$ substrate using as-transferred graphene without the annealing process of block 208. Column 1206 illustrates the carrier mobility (3800 cm$^2$/V-s for electrons; 11,000 cm$^2$/V-s for holes) and Dirac point (35 V) for a graphene transistor fabricated on an ODTS-coated SiO$_2$ substrate and further employing the annealing process of block 208. It is noted that the electrical characterization of FIGS. 11 and 12 were conducted at room temperature. While ODTS-coated SiO$_2$ is used (e.g., in FIG. 12) to illustrate the benefit of embodiments of the present disclosure, it will be understood that other hydrophobic materials, other substrates, other dielectric materials, etc., may equally be used for similar benefit, without departing from the scope of the present disclosure.

The various embodiments described herein offer several advantages over the existing art. It will be understood that not all advantages have been necessarily discussed herein, no particular advantage is required for all embodiments, and other embodiments may offer different advantages. As one example, embodiments discussed herein include methods and structures for providing high-quality transferred graphene layers (e.g., onto a substrate including an insulating layer) that are substantially flat and which exhibit reduced substrate-effects (e.g., including reduction of charge-transfer doping of the graphene layer due to charged substrate impurities), for example by transferring graphene onto a hydrophobic surface of a hydrophobic layer and performing a thermal treatment process (e.g., an anneal). In various embodiments, as a result of forming the hydrophobic layer over a dielectric layer prior to graphene layer transfer, charged impurities may be prevented from adsorbing to the hydrophobic surface coating of the dielectric layer and/or the hydrophobic surface coating of the dielectric layer may serve to screen charged impurities residing within the dielectric layer and/or within the underlying substrate. Thereafter, in various embodiments, the as-transferred graphene layer may be annealed. As a result of the annealing process, the as-transferred graphene, on the hydrophobic surface, may be flatter and cleaner, and may thereby exhibit improved carrier mobility. In some embodiments, after the annealing process, top electrodes (e.g., source/drain electrodes) may be deposited onto the annealed graphene layer. In some examples, a top dielectric layer may also be formed over the graphene layer, and a top-gate electrode may be formed over the top dielectric layer.

Thus, one of the embodiments of the present disclosure described a method for fabricating a device (e.g., a graphene device), where the method includes providing a substrate including an insulating layer, and forming a hydrophobic layer over the insulating layer. In various embodiments, a graphene layer is transferred onto the hydrophobic layer. By way of example, the transferred graphene layer has a first carrier mobility. In some embodiments, after transferring the graphene layer, an annealing process is performed, and the annealed graphene layer has a second carrier mobility greater than the first carrier mobility.

In another of the embodiments, discussed is a method where a substrate including a dielectric layer disposed thereon is provided. In some examples, a surface of the dielectric layer is cleaned to remove organic residues, and a hydrophobic layer is formed on the cleaned surface of the dielectric layer. Thereafter, in some embodiments, a CVD-grown graphene film is transferred onto the hydrophobic layer, where the CVD-grown graphene film has a first electron mobility and a first hole mobility. In various embodiments, after transferring the CVD-grown graphene film, an annealing process is performed, where the annealed CVD-grown graphene film has a second electron mobility greater than the first electron mobility and a second hole mobility greater than the first hole mobility.

In yet another of the embodiments, discussed is a device including a substrate having a dielectric layer disposed over the substrate. By way of example, the device further includes a hydrophobic layer formed over the dielectric layer. In some embodiments, the hydrophobic layer may include at least one of ODTS, OTS, PTFE, PE, PP, PS, PI, and wax. The device also includes a graphene layer disposed on the hydrophobic layer, where the graphene layer includes CVD-grown graphene, and source and drain electrodes in contact with the graphene layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a substrate including an insulating layer;
depositing an octadecyltrichlorosilane (ODTS) multilayer film or an octyltrichlorosilane (OTS) multilayer film over the insulating layer;
cleaning a surface of the deposited ODTS multilayer film or the deposited OTS multilayer film in a solution including both anhydrous toluene and ethanol;
transferring a graphene layer onto the cleaned surface of the deposited ODTS multilayer film or the deposited OTS multilayer film, wherein the transferred graphene layer has a first carrier mobility; and
after transferring the graphene layer, performing an annealing process, wherein the annealed graphene layer has a second carrier mobility greater than the first carrier mobility.

2. The method of claim 1, further comprising:
after performing the annealing process, forming source and drain electrodes in contact with the graphene layer.

3. The method of claim 1, wherein the insulating layer includes a silicon dioxide layer formed over the substrate, and wherein the substrate is used as a global back-gate.

4. The method of claim 1, wherein the substrate is an insulating substrate, and wherein the insulating layer includes the insulating substrate.

5. The method of claim 2, further comprising:
after forming the source and drain electrodes, depositing a top-gate dielectric layer over the graphene layer; and
forming a top-gate electrode on the top-gate dielectric.

6. The method of claim 1, wherein ODTS or OTS is provided as a solution in anhydrous toluene, and wherein the substrate including the insulating layer is immersed into the solution for about 24 hours to form the deposited ODTS multilayer film or the deposited OTS multilayer film.

7. The method of claim 1, wherein the transferring the graphene layer onto the cleaned surface of the deposited ODTS multilayer film or the deposited OTS multilayer film is performed using a polymer-free transfer process.

8. The method of claim 1, wherein the performing the annealing process includes performing the annealing process at an annealing temperature from about 150° C. to about 250° C.

9. The method of claim 1, wherein the performing the annealing process includes performing the annealing process for a duration from about 10 minutes to about 240 minutes.

10. The method of claim 1, wherein the performing the annealing process includes performing the annealing process in at least one of a nitrogen ambient and a noble gas ambient.

11. A method, comprising:
providing a substrate including a dielectric layer disposed thereon;
cleaning a surface of the dielectric layer to remove organic residues;
forming a hydrophobic layer on the cleaned surface of the dielectric layer;
after forming the hydrophobic layer, cleaning a surface of the hydrophobic layer in a solution of anhydrous toluene and ethanol;
transferring a CVD-grown graphene film onto the cleaned surface of the hydrophobic layer, wherein the CVD-grown graphene film has a first electron mobility and a first hole mobility; and
after transferring the CVD-grown graphene film, performing an annealing process, wherein the annealed CVD-grown graphene film has a second electron mobility greater than the first electron mobility and a second hole mobility greater than the first hole mobility.

12. The method of claim 11, further comprising:
after performing the annealing process, forming source and drain electrodes in contact with the CVD-grown graphene film;
depositing a top-gate dielectric layer over the CVD-grown graphene film; and
forming a top-gate electrode over the top-gate dielectric.

13. The method of claim 11, wherein the hydrophobic layer includes a hydrophobic material including at least one of octadecyltrichlorosilane (ODTS), octyltrichlorosilane (OTS), polytetrafluoroethylene (PTFE), polyethylene (PE), polypropylene (PP), polystyrene (PS), polyimide (PI), and wax.

14. The method of claim 13, wherein the hydrophobic layer includes a hydrophobic surface having a contact angle (CA) of between about 90° and about 150°, and wherein the CVD-grown graphene film is transferred onto the hydrophobic surface of the hydrophobic layer.

15. The method of claim 11, wherein the CVD-grown graphene film includes one of monolayer graphene, bilayer graphene, and multi-layer graphene.

16. The method of claim 11, wherein performing the annealing process includes ramping up from about 25° C. to an annealing temperature of about 200° C. at a ramp rate of about 60° C. per minute.

17. The method of claim 16, wherein the performing the annealing process includes performing the annealing process at the annealing temperature for a duration of about 120 minutes.

18. The method of claim 17, wherein performing the annealing process includes ramping down from the annealing temperature to about 25° C. at a ramp rate of about 1° C. per minute.

19. A method, comprising:
providing a substrate including an insulating layer;
depositing an octadecyltrichlorosilane (ODTS) multilayer film or an octyltrichlorosilane (OTS) multilayer film over the insulating layer;
transferring a bilayer or multi-layer graphene film onto the deposited ODTS multilayer film or the deposited OTS multilayer film, wherein the transferred bilayer or multi-layer graphene film has a first carrier mobility;
after transferring the bilayer or multi-layer graphene film, performing an annealing process, wherein the annealed bilayer or multi-layer graphene film has a second carrier mobility greater than the first carrier mobility;
coating a surface of the annealed bilayer or multi-layer graphene film with at least one of CdSe/ZnS quantum dots and PbS quantum dots; and
forming source and drain electrodes in contact with the annealed bilayer or multi-layer graphene film.

20. The method of claim 19, further comprising:
performing the annealing process at an annealing temperature of about 200° C. for a duration of about 120 minutes.

* * * * *